United States Patent
Bharatan

(10) Patent No.: US 9,359,188 B1
(45) Date of Patent: Jun. 7, 2016

(54) MEMS MICROPHONE WITH TENSIONED MEMBRANE

(71) Applicant: INVENSENSE, INC., San Jose, CA (US)

(72) Inventor: Sushil Bharatan, Burlington, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/543,676

(22) Filed: Nov. 17, 2014

(51) Int. Cl.
  *H01L 29/84* (2006.01)
  *B81B 3/00* (2006.01)
  *B81C 1/00* (2006.01)
  *H04R 23/00* (2006.01)

(52) U.S. Cl.
  CPC ........... *B81B 3/0027* (2013.01); *B81C 1/00158* (2013.01); *H04R 23/00* (2013.01); *B81B 2201/0257* (2013.01); *H04R 2201/003* (2013.01)

(58) Field of Classification Search
  CPC ... B81B 3/0027; B81C 1/00158; H04R 23/00
  See application file for complete search history.

(56) References Cited

U.S. PATENT DOCUMENTS

2009/0278217 A1* 11/2009 Laming ............... B81C 1/00158
                                                            257/419

* cited by examiner

*Primary Examiner* — Long Pham
(74) *Attorney, Agent, or Firm* — Amin, Turocy & Watson, LLP

(57) ABSTRACT

A micro electro-mechanical system (MEMS) microphone is provided. The MEMS microphone is configured to operate at a predetermined range of frequencies. The MEMS microphone has a tensioned membrane preset at a tension amount selected to cause the MEMS microphone to operate at a predetermined sensitivity level that is above a threshold sensitivity level. The tension amount is controlled based on a temperature applied to the tensioned membrane during a fabrication process. At least a portion of the tensioned membrane is sandwiched between a first conductive layer and a second conductive layer configured to equalize stress of the tensioned membrane.

11 Claims, 8 Drawing Sheets

MEMS MICROPHONE WITH TENSIONED MEMBRANE

TECHNICAL FIELD

Embodiments of the subject disclosure relate generally to micro electro-mechanical system (MEMS) microphones, and particularly to MEMS microphones with tensioned membranes.

BACKGROUND

MEMS microphones include a membrane that is electrically isolated from a back plate. The membrane is mechanically supported at a distance (e.g., typically 3 to 5 microns (μm)) from the back plate. The membrane and the back plate form a capacitor. Receipt of an audible signal (e.g. sound pressure) causes the membrane to vibrate, which generates a signal that represents the audio signal. This audio signal can be amplified, recorded, or otherwise transmitted to another electronic device.

Differences can exist between MEMS microphones related to various properties of the MEMS microphones. The various properties can include a sensitivity level of the MEMS microphone, an audio bandwidth of the MEMS microphone, a resonant frequency level, a maximum pressure level, and so forth. Thus, a challenge associated with MEMS microphones, and the fabrication of the MEMS microphones, relates to selectively controlling the various properties such that the MEMS microphone exhibits the desired properties.

SUMMARY

In one embodiment, a micro electro-mechanical system (MEMS) microphone is provided. The MEMS microphone is configured to operate over a predetermined range of frequencies. Further, the MEMS microphone has a tensioned membrane preset at a tension amount selected to cause the MEMS microphone to operate at a predetermined sensitivity level that is above a threshold sensitivity level.

In another embodiment, a method for fabricating a micro electro-mechanical system (MEMS) microphone is provided. The method includes selecting a tension amount of a membrane to cause the MEMS microphone to operate at a predetermined sensitivity level that is above a threshold sensitivity level. Further, the MEMS microphone is configured to operate over a predetermined range of frequencies. The method also includes stretching the membrane to obtain the tension amount.

According to another embodiment, a micro electro-mechanical (MEMS) microphone is provided. The MEMS microphone includes a package substrate comprising a port disposed through the package substrate, wherein the port is configured to receive acoustic waves. The MEMS microphone also includes a lid mounted to the package substrate, wherein the package substrate and the lid form a package comprising an internal chamber. Further, the MEMS microphone includes a tensioned membrane disposed in the internal chamber and electrically bonded to an application-specific integrated circuit (ASIC), which is bonded to the package substrate. The tensioned membrane is positioned such that the acoustic waves received at the port are incident on the tensioned membrane. Further, the tensioned membrane is configured to operate over a predetermined range of frequencies and the tensioned membrane is preset at a tension amount selected to cause the MEMS microphone to operate at a predetermined sensitivity level.

A further understanding of the nature and the advantages of particular embodiments disclosed herein can be realized by reference of the remaining portions of the specification and the attached drawings.

DETAILED DESCRIPTION

Figure 1:
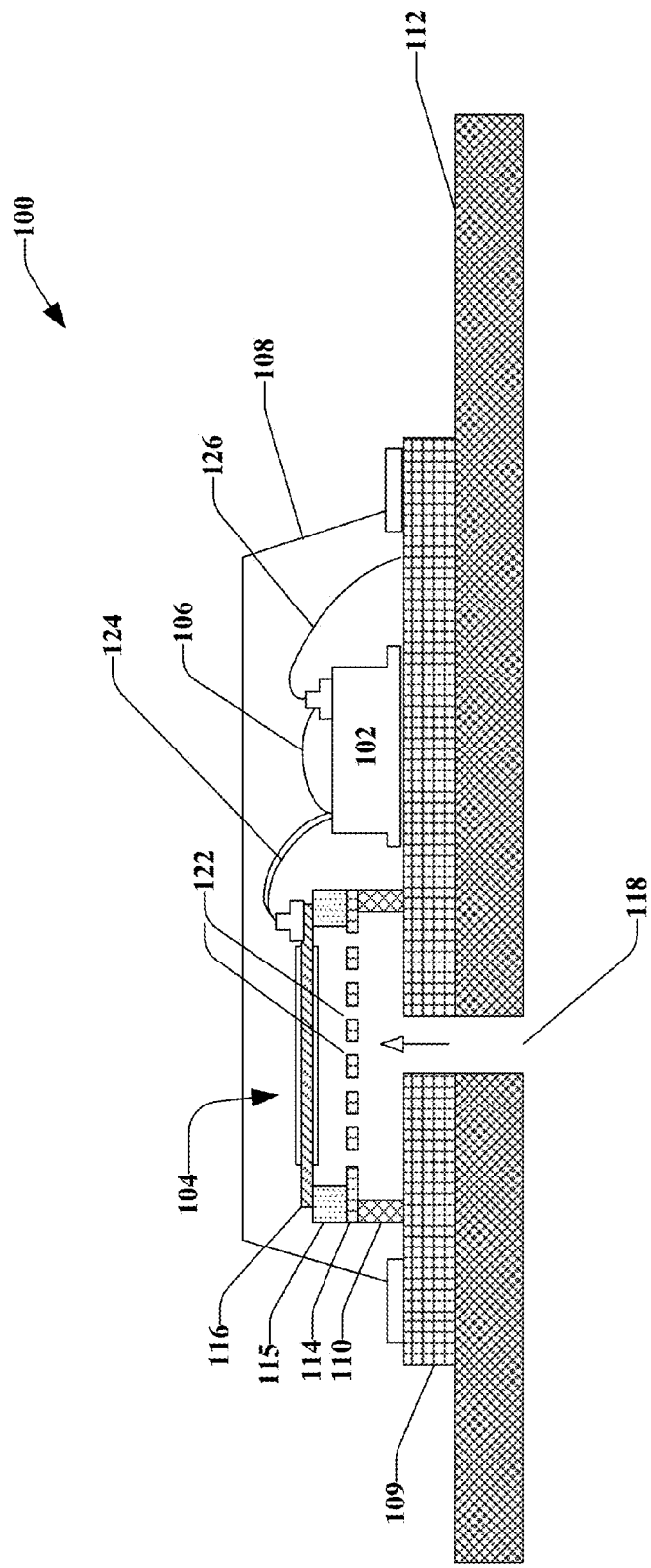
FIG. 1 illustrates a block diagram of a MEMS microphone integrated package.

A microphone is a device that converts sound pressure from acoustic waves received at a sensor to electrical signals. Microphones are used in numerous different applications including, but not limited to, hearing aids, voice recordation systems, speech recognition systems, audio recording and engineering, public and private amplification systems, and the like.

MEMS microphones have numerous advantages as compared to other microphones. Such advantages include, but are not limited to, low power consumption, and high performance. Additionally, MEMS microphones are available in small packages and facilitate use in a wide variety of applications that require a device with a small footprint. A MEMS microphone can function as a capacitive-sensing device, or acoustic sensor, that includes a pressure-sensitive membrane that vibrates in response to sound pressure resultant from an acoustic wave incident on the membrane. The acoustic sensors are often fabricated employing silicon wafers in highly automated production processes that deposit layers of different materials on the silicon wafer and then employ etching processes to create the membrane and a back plate. The air moves through the back plate to the membrane, which deflects in response to the sound pressure associated with the air.

The change in capacitance is converted into an electrical signal. The electrical signal can be processed by an application specific integrated circuit (ASIC) for performing any number of functions of the MEMS microphone.

Embodiments described herein relate to a MEMS microphone that includes a tensioned membrane to which a controlled amount of tension is applied during fabrication of the MEMS microphone. The equation for deflection of a membrane has two contributions: (1) the material property (Young's module) and (2) the tension on the membrane. Young's module is a measure of elasticity, which can be equal to the ratio of the stress acting on a substance to the strain produced. When the term "tensioned membrane" is used, it implies that the contribution from tension dominates over the material property. The tension is usually greater than 100 Megapascals (Mpa) to achieve this condition (e.g., a tensioned membrane).

The amount of tension applied is selected based on a desired amount of sensitivity of the microphone, based on a desired range of audio frequencies or operational frequencies (e.g., an amount of bandwidth) of the microphone, or based on other desired performance or parameters of the microphone. The amount of tension applied can also depend on the construction of the sensor, such as the radius of the membrane and the thickness of the membrane, for example.

The membrane can be formed from non-conductive material, such as silicon nitride or a similar material, or a piezoelectric material or similar material, or a conductive material such as polysilicon, for example. The tension of the membrane can be controlled by subjecting the microphone to a particular (defined) temperature during the fabrication process (e.g., controlling a deposition temperature, controlling an annealed temperature, and so on). The processing temperatures can be around 1000 degrees Celsius, for example.

For example, a first temperature can create a high tension on the membrane, a second temperature can create a low tension on the membrane, and temperatures between the first temperature and second temperature can produce a tension between the high tension and the low tension. A higher amount of tension can result in a microphone having a lower sensitivity level and a higher range of operational frequencies. A lower amount of tension can result in a microphone having a higher sensitivity level and a reduced amount of range of operational frequencies. According to an aspect, a thickness and a radius of a membrane remains constant while different MEMS microphones having different performance characteristics are fabricated as a function of controlling a tension amount of the membrane.

Turning now to the figures, FIG. 1 illustrates a block diagram of a MEMS microphone integrated package. As illustrated, the MEMS microphone integrated package, referred to herein simply as a MEMS microphone 100, includes a control component 102 and an acoustic sensor 104. The control component 102 can be, for example, a system, and application specific integrated circuit (ASIC), and so forth.

Further, the control component 102 can include computing device(s), memory device(s), computing system(s), logic, and so forth, for generating stimuli and detecting a response to the stimuli. For example, the stimuli can be generated via a transmit (TX) component 106. Detecting the response to the stimuli can be performed by a receiver (RX) component.

The control component 102 can also include computing device(s), memory device(s), computing system(s), logic, and so forth, for determining, based on the stimuli and the response to the stimuli, a frequency response of an acoustic sensor 104. Determining the frequency response can be performed by a processing component. In this regard, the processing component can determine, based on the frequency response, whether the acoustic resonator has responded to sound pressure. The frequency response reproduces the frequency and amplitude content of the incoming sound.

The MEMS microphone can also include a lid 108 and a base 109, which form an internal chamber for containing the MEMS microphone 100. Further, the base 109 can be supported on a device printed circuit board (PCB) 112.

The MEMS microphone 100 also includes a back plate 114, supported on a substrate 110. The substrate 110 is supported by the base 109. Further, a membrane 116 is supported by an isolation layer 115 (e.g., dielectric material) and the back plate 114. The substrate 110, base 109, and printed circuit board 112 form an audio port 118 (or acoustic sound port). Further, the back plate 114 includes air channels 122, a few of which are labeled, through which sound waves move after entering the audio port 118. The sound waves entering the audio port 118 cause the membrane 116 to move in response to the air entering the audio port 118. In one embodiment, the back plate 114 is closer to the audio port 118 than the membrane 116, as is shown in FIG. 1. In another embodiment, the membrane 116 is closer to the audio port 118 than the back plate 114 (not shown). In this embodiment, for example, the placements of the membrane 116 and the back plate 114 shown in FIG. 1 are swapped with each other in relation to the isolation layer 115, such that the back plate 114 and the membrane 116 remain on opposite sides of the isolation layer 115. In this embodiment, the substrate 110 supports the membrane 116.

The audio port 118 can be any size suitable for receiving and/or detecting the acoustic waves intended to enter the MEMS microphone 100. Specifically, the audio port 118 can provide a recess/opening to an external environment outside of the MEMS microphone 100 such that sound generated external to the MEMS microphone 100 is received by the audio port 118. Accordingly, the audio port 118 can be positioned at any number of different locations within the base 109 in suitable proximity to the acoustic sensor that allows the acoustic sensor to detect the sound generated external to the MEMS microphone 100.

Figure 2:
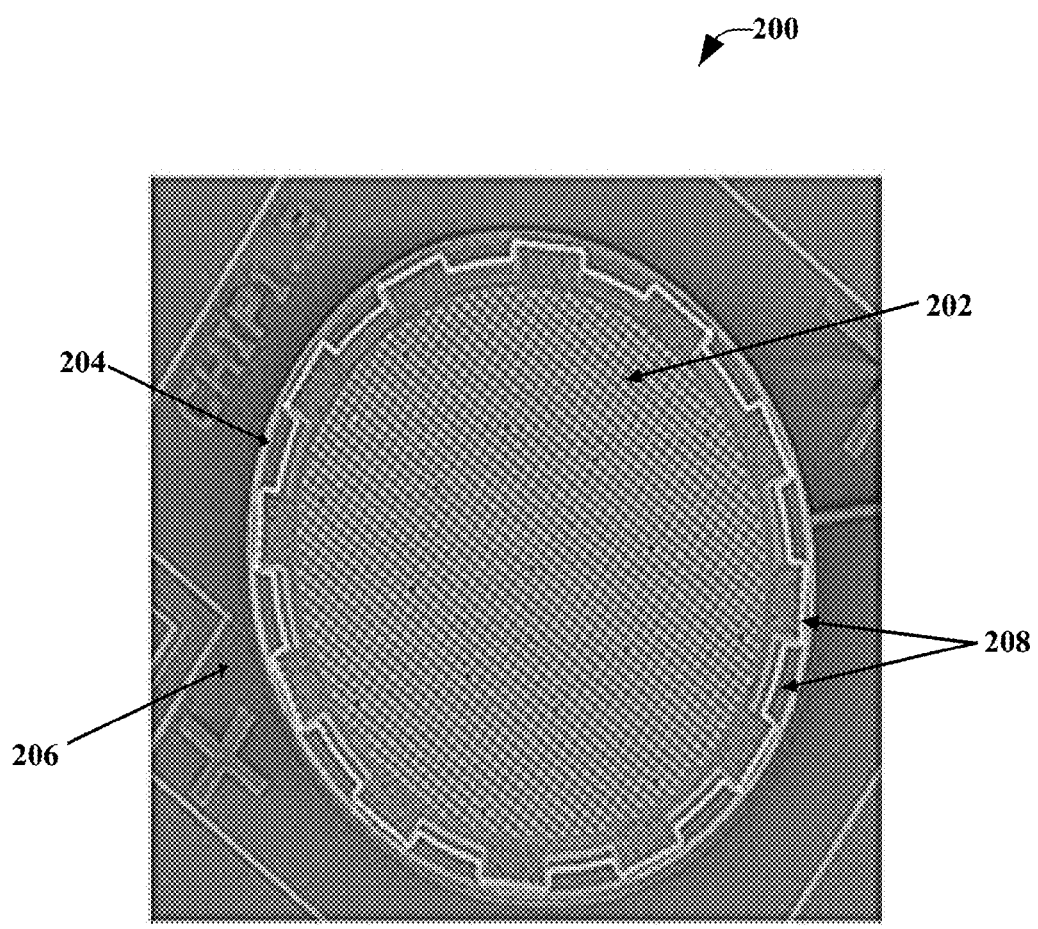
FIG. 2 illustrates a scanning electron microscope image of a membrane of a MEMS microphone.

Although the components are illustrated in a particular arrangement in FIG. 1, in other embodiments, any number of different arrangements of the components is possible and envisaged. For example, any number of arrangements that place the audio port 118 in proximity to the acoustic sensor such that sound waves can be detected at the acoustic sensor can be employed. As another example, any configuration of the ASIC, the acoustic sensor, and/or wire bonds 124 and 126, that electrically couple the ASIC and the acoustic sensor can be employed. According to some implementations, there can be two wire bonds 124 from the ASIC (e.g., control component 102) to the MEMS sensor (e.g., acoustic sensor 104). Further, the transmit component 106 can connect the ASIC to itself, and also the MEMS sensor (e.g., acoustic sensor 104). It is noted that the disclosed aspects are not limited to the particular arrangement of FIG. 1, FIG. 2 illustrates a scanning electron microscope (SEM) image 200 of a membrane 202 (e.g., a membrane 306 of FIG. 3) of a microphone. The membrane 202 is connected to a frame 204 (e.g., a dielectric material 308 of FIG. 3) of a device 206 (e.g., a substrate 302 of FIG. 3) with springs 208 that allow the membrane 202 to move up and down in response to sound waves entering an acoustic port (e.g., the audio port 118) of the microphone.

Although FIG. 2 illustrates an embodiment in which a membrane is attached to the device with springs, springs are not utilized in other embodiments. Instead, the membrane is attached to the device utilizing other means. For example, the membrane can be directly attached to an isolation layer (e.g., dielectric material) without springs. Further to this example, the amount of deflection at the edge of the membrane would be lower in comparison to an embodiment in which springs are used. Thus, the use of springs allows the membrane to be more compliant.

Since MEMS microphones can be used in different components or applications, the properties associated with the microphone might need to be altered based on the components or the applications. Generally, when various properties or parameters need to be changed for a MEMS microphone during fabrication, a thickness of the membrane (e.g., membrane 116 of FIG. 1) is altered. For example, the MEMS microphone can be fabricated with a thin membrane to achieve a microphone with a higher sensitivity level, a lower resonant frequency, a lower maximum pressure level, and so on. To achieve a microphone with a lower sensitivity level, a higher resonant frequency, a higher-pressure level, and so on, the MEMS microphone can be fabricated with a thicker membrane. Another option for a spring based membrane is to change the length and/or width of the spring. A further option is to have devices of different sizes (e.g., differing diaphragm radii).

Although different membrane thickness can be utilized in an attempt to achieve the desired properties, the manufacture of the microphone with these different membranes can increase costs and, further, different deposition recipes and times are needed. For example, the multiple different thickness membranes must be ordered, stored, inventoried, and so on. Further, quality control related to these membranes must be monitored for each of the respective thicknesses.

To overcome the above challenges associated with changing a thickness of a membrane, the disclosed aspects provide a MEMS microphone with different properties based on an amount of tension applied to the membrane during a fabrication process. Thus, a single size and thickness membrane can be used across a number of different MEMS microphone types and the properties of the different MEMS microphones are controlled based on the membrane tension.

Figure 3:
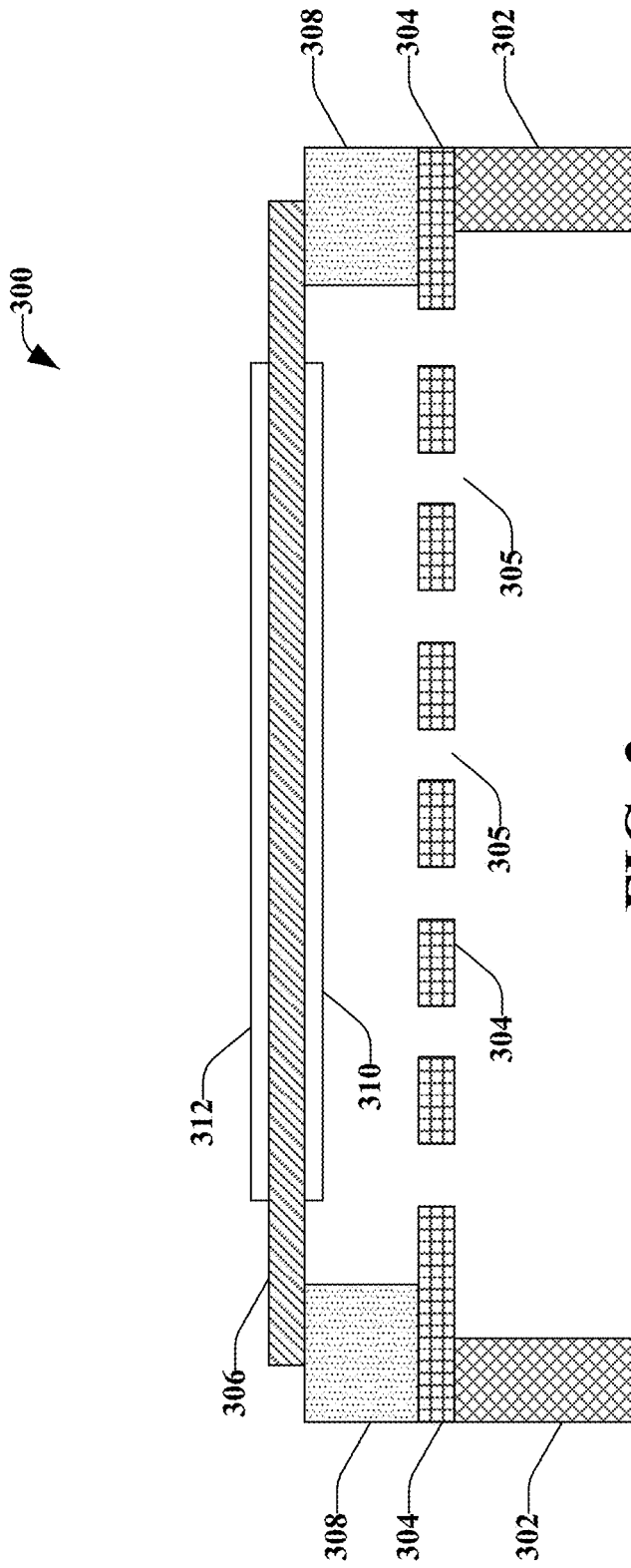
FIG. 3 illustrates an example, non-limiting block diagram, sectional view of a MEMS sensor, according to an aspect.

FIG. 3 illustrates an example, non-limiting block diagram, sectional view of a MEMS sensor 300, according to an aspect. The MEMS sensor 300 (e.g., acoustic sensor 104 of FIG. 1), comprises a tensioned membrane wherein an amount of tension applied to the membrane is selected based on one or more defined operating parameters of the MEMS sensor 300. For example, based on a first defined operating parameter for a first MEMS microphone, the amount of tension applied to the membrane can be a first amount of tension. Further, based on a second defined operating parameter for a second MEMS microphone, the amount of tension applied to the membrane can be a second amount of tension. Thus, MEMS microphones having different operating parameters can be manufactured using standard components using the disclosed aspects.

Further, the MEMS sensor 300 can be configured to operate over a predetermined range of frequencies. Further, the MEMS sensor 300 can comprise a tensioned membrane that is preset at a tension amount selected to cause the MEMS microphone to operate at a predetermined sensitivity level that is above a threshold sensitivity level.

The MEMS sensor 300 can include the substrate 302. The substrate 302 can be a silicon substrate. According to an implementation, the substrate 302 can be positioned on a polymer substrate or a ceramic substrate (e.g., substrate 110 of FIG. 1).

Supported on (e.g., formed on) the substrate 302 can be a back plate 304 (e.g., back plate 114 of FIG. 1). The back plate 304 can comprise air channels 305 (e.g., holes or openings or. through-hole apertures, a few of which are labeled). For example, the back plate 304 can be a perforated plate used as an electrode to electrically sense the membrane 306 (e.g., membrane 116 of FIG. 1). A membrane may also be referred to as a diaphragm. According to various aspects, the perforations can be acoustic openings for reducing air damping in the back plate 304. In some implementations, the back plate 304 can be constructed such it has very little (if any) deflection. In an alternate embodiment from the one shown in FIG. 3, the placements of the membrane 306 and the back plate 304 are swapped with each other, such that they are still on opposite sides of the dielectric material 308. In this embodiment, the substrate 302 supports the membrane 306.

The back plate 304 may be composed of a conductive material. However, according to other implementations, the back plate 304 may be composed of non-conductive material. According to the implementations where the back plate 304 is composed of non-conductive material, the MEMS sensor 300 comprises a metallization layer (not shown).

Formed on at least a portion of the back plate 304 is the dielectric material 308 (e.g., isolation layer 115 of FIG. 1). The dielectric material 308 defines the sense gap. The sense gap is defined as a width, or distance, between the rest position of the membrane 306 and the back plate 304.

In some embodiments, the membrane 306 and the back plate 304 can be positioned substantially parallel to one another when the membrane 306 is at rest. In other embodiments, at least a portion of the membrane 306 and the back plate 304 are positioned substantially parallel to one another when the membrane 306 is at rest. As used herein, the membrane 306 and the back plate 304 are at rest when the membrane 306 is not in a state of deflection and is substantially flat.

The membrane 306 is attached to the dielectric material 308, such as by clamping at least a portion of the membrane 306 to the dielectric material 308. According to an implementation, the membrane 306 can be attached to the dielectric material 308 by springs (as illustrate in FIG. 2) or by other attachment types. In accordance with another implementation, the clamping condition can be created by depositing (at a high temperature) the diaphragm (e.g., membrane 306) onto the dielectric material 308 (e.g., through chemical adhesion).

During fabrication of the MEMS sensor 300, the tension amount of the membrane is controlled based on a temperature applied to the membrane during a fabrication process, resulting in a tensioned membrane. The tensioned membrane can be formed of non-conductive material. For example, the non-conductive material can be silicon nitride. According to another example, the tensioned membrane can be formed of a piezoelectric material. In accordance with still another example, the tensioned membrane can be formed of a piezoresistive material. In still another example, the tensioned membrane can be formed of a polymeric material.

In order to apply the desired amount of tension to the membrane, different deposition temperatures and/or different annealed temperatures can be applied to the MEMS sensor 300 during fabrication. For example, if the membrane is composed of silicon nitride of a given thickness, by depositing the silicon nitride at a defined temperature and/or by using a defined annealed temperature after the deposition, a defined stress or a defined tension can be created. Thus, the tension can be selectively created in the fabrication process by changing a deposition temperature and/or the annealed temperature of the membrane material.

Since the tension is created during fabrication, the tension is fixed in the field (e.g., during use). The selective amount of tension applied to the membrane creates microphones having different properties. For example, a membrane having a high tension can have a lower sensitivity level, a higher bandwidth, and a higher resonant frequency as compared to a membrane having a lower tension amount. In a similar manner, a membrane having a low tension amount, can have a higher sensitivity level, a reduced bandwidth, and a lower resonant frequency as compared to membranes having a higher tension amount. In an example, a low tension can be a value that results in a resonant frequency of about 20 kHz and high tension could result in a frequency of more than 50 kHz.

Figure 4:
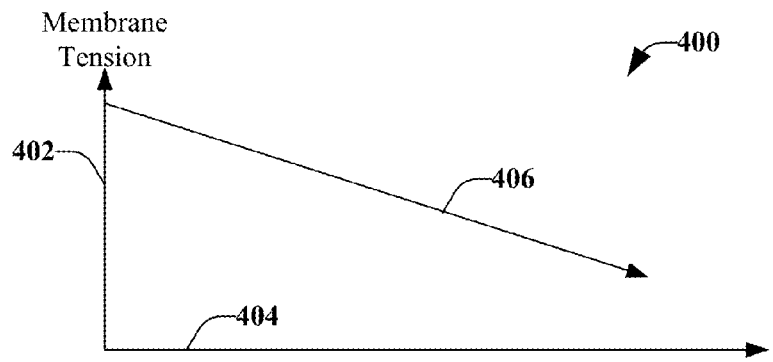
FIG. 4 is an example, non-limiting graph demonstrating the result of membrane tension amounts on the MEMS microphone sensitivity level.
Figure 5:
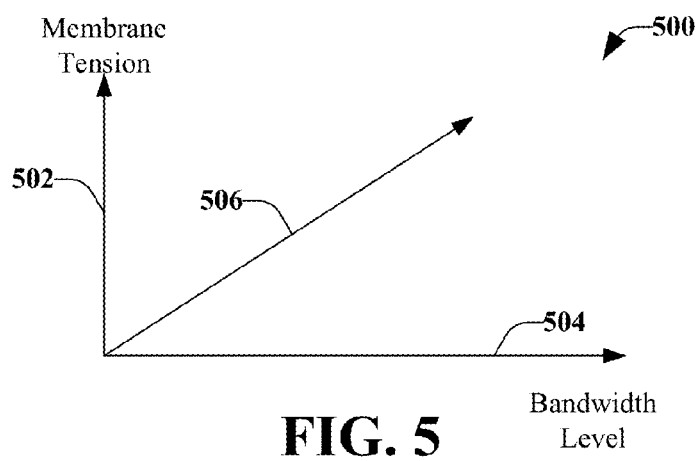
FIG. 5 is another example, non-limiting graph demonstrating the result of membrane tension amounts on the MEMS microphone bandwidth.
Figure 6:
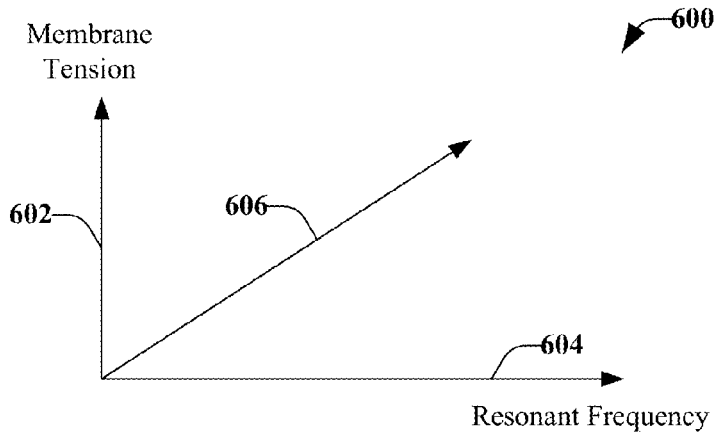
FIG. 6 is a further example, non-limiting graph demonstrating the result of membrane tension amounts of the MEMS microphone resonant frequency.

FIGS. 4-6 demonstrate the results of membrane tension on each of the sensitivity level (FIG. 4), the bandwidth level (FIG. 5), and the resonant frequency (FIG. 6). FIG. 4 (not to scale) illustrates that as a membrane tension amount 402 is increased, there is a corresponding decrease in the sensitivity level 404, as indicated by line 406. FIG. 5 (not to scale) illustrates that as a membrane tension amount 502 is increased, there is a corresponding increase in the bandwidth 504, as indicated by line 506. Further, FIG. 6 (not to scale) illustrates that as the membrane tension amount 602 is increased, there is a corresponding increase in the resonant frequency 604, as indicated by line 606.

According to some implementations, the temperatures applied can cause the membrane 306 to stretch such that a selective amount of tension is applied to the membrane 306. It is noted that the membrane 306 is not physically stretched. Instead, the membrane is deposited at a high temperature and then cooled (e.g., to room temperature), which allows the tension to develop in the membrane.

The material used to form the tensioned membrane can be a dielectric material (e.g., silicon nitride). Therefore, there can be a metallization layer or a thin polysilicon layer, or another conductive material deposited on the membrane (e.g., the silicon nitride).

As illustrated in FIG. 3, a first conductive layer 310 can be applied to a first side of the membrane 306 and a second conductive layer 312 can be applied to a second side of the membrane 306, wherein the first side and the second side are opposite sides of the membrane. The first conductive layer 310 and the second conductive layer 312 may be placed on both sides of the membrane 306 to equalize stress (e.g., reduce curvature of the membrane 306). For example, stress can be produced by the fabrication process. Having a conductive layer on just one side can lead to a stress due to imbalance. Therefore, having the conductive layer on both sides of the diaphragm (or back plate) can balance the stress.

According to some implementations, the first conductive layer 310 and the second conductive layer 312 are deposited only at a center portion, or substantially center portion, of the membrane 306. Depositing the conductive layers only at, or near, the center portion can increase a sensitivity of the membrane. This increased sensitivity is created because the maximum deflection of the membrane occurs at the center portion, since the edges are operatively attached to the back plate and do not move. By sensing the signal only at, or near, the center portion, the increased sensitivity is achieved.

For example, the first conductive layer 310 and the second conductive layer 312 can be deposited at a shape having a radius that is less than a full radius of the structure (e.g., membrane 306). For example, the shape is a radius between 0.3 and 0.9 of the membrane 306. In a further example, the shape is a radius between 0.4 and 0.8 of the membrane 306. In another example, the shape can be radius between 0.5 and 0.7 of the membrane. In another example, the shape can be a radius about 0.6 of the membrane 306. It is noted that although the shape is defined with respect to a radius, the shape can take many different forms including a circle, an oval, an oblong shape. Further, the shape can be non-circular, such as approximately polygonal, ovoid, and so on. In addition, the shape can have an irregular shape.

According to some implementations, the first conductive layer 310 and the second conductive layer 312 are deposited at a same radius amount. In accordance with some implementations, the first conductive layer 310 is deposited at a first radius amount and the second conductive layer 312 is deposited at a second radius amount that is different from the first radius amount.

Figure 7:
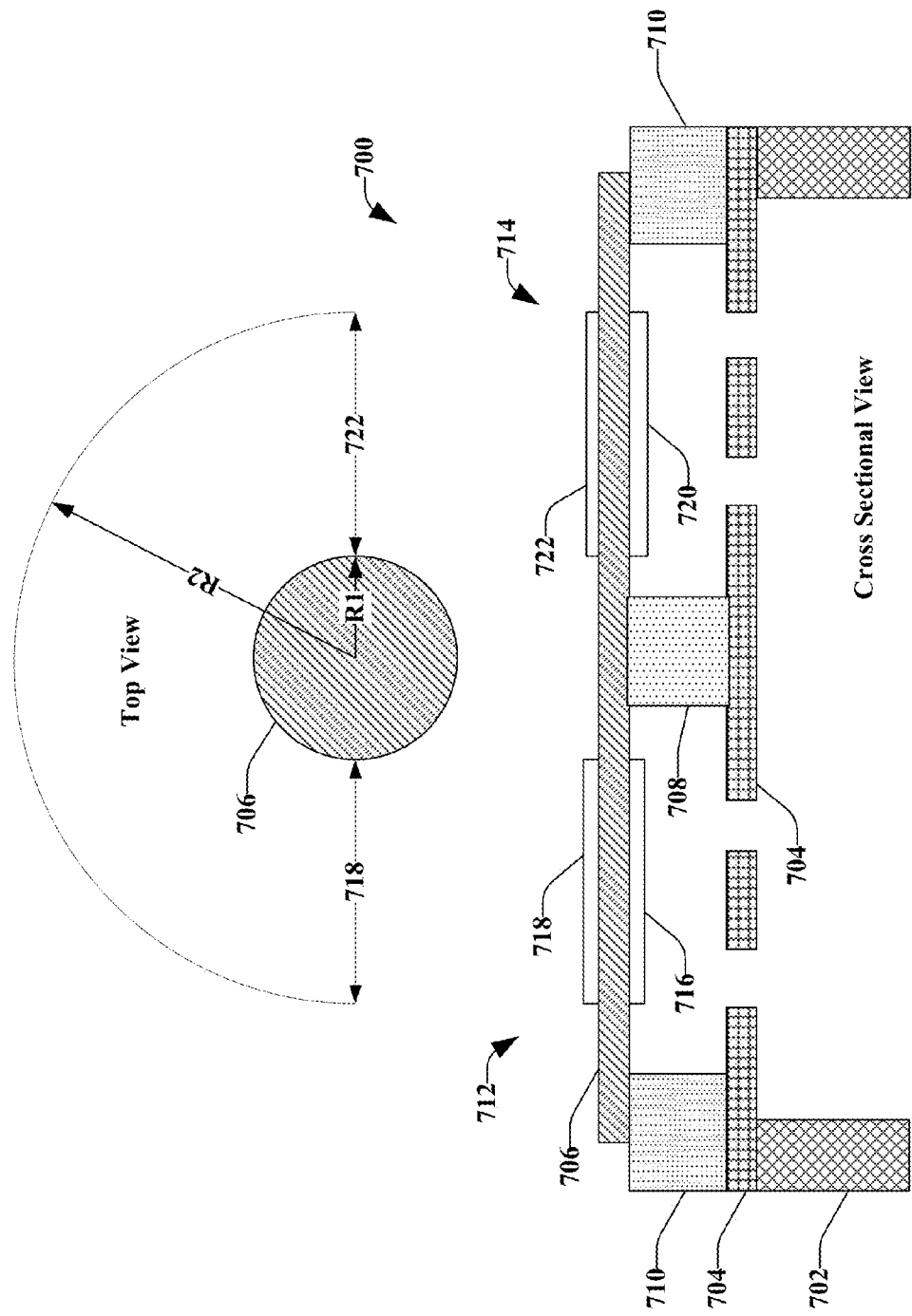
FIG. 7 illustrates example, non-limiting block diagram sectional and top views of a MEMS sensor, according to an aspect.

FIG. 7 illustrates example, non-limiting block diagram sectional and top views of a MEMS sensor, according to an aspect. The MEMS sensor 700 can be configured to operate over a predetermined range of frequencies. Further, the MEMS sensor 700 can comprise a tensioned membrane configured to operate over a predetermined range of frequencies and the tensioned membrane is preset at a tension amount selected to cause the MEMS microphone to operate at a predetermined sensitivity level.

Similar to the MEMS sensor 300 discussed above with reference to FIG. 3, the MEMS sensor 700 includes a substrate 702, which is usually silicon and can be positioned over a package substrate according to an aspect. For example, the package substrate can be composed of a polymer or a ceramic material.

A back plate 704 can be supported on (e.g. formed on) the substrate 702. The back plate 704 may be composed of a conductive material. According to some implementations, the back plate 704 may be composed of non-conductive material. According to the implementations where the back plate 704 is composed of non-conductive material, the MEMS sensor 700 comprises a metallization layer (not shown).

The back plate 704 can comprise holes or openings (e.g., through-hole apertures). For example, the back plate 704 can be a perforated plate used as an electrode to electrically sense a movement of membrane 706. According to various aspects, the perforations can be acoustic openings for reducing air damping in moving portions of the back plate 704. As illustrated, the back plate 704 of the MEMS sensor 700 has a different opening structure than the MEMS sensor 300 of FIG. 3. The opening structure of the back plate 704 is configured to accommodate a post 708. In an alternate embodiment from the one shown in FIG. 7, the placements of the membrane 706 and the back plate 704 are swapped with each other, such that they are still on opposite sides of the dielectric material 710 and the post 708. In this embodiment, the substrate 702 supports the membrane 706.

The post 708 can be formed between a portion of the back plate 704 and a portion of the membrane 706. According to some implementations, the post 708 can be formed of dielectric material. The post 708 can be configured to substantially reduce sagging (e.g., curvature) of the membrane and/or reduce variations in curvature. Although the post 708 is illustrated at, or near, a center of the MEMS sensor 700, the post 708 could be located at another portion of the MEMS sensor 700. Further, according to some implementations, more than one post can be utilized.

The post 708 can be a center post that is a substantially hard contact joining a portion of the membrane 706 and a portion of the back plate 704. The hard contact is formed and positioned such that when the sound pressure is incident on the back plate and the membrane, only the membrane deflects.

The MEMS sensor 700 can also include a dielectric material 710 (e.g., oxide) formed on at least a portion of the back plate 704. The dielectric material 710 can define the sense gap. Further, the membrane 706 is attached to the dielectric material 710 and the post 708. For example, the membrane 706 can be attached to the dielectric material 710 with springs (as illustrated in FIG. 2) or by other attachment types.

During fabrication of the MEMS sensor 700, the tension amount can be controlled based on a temperature applied to the membrane 706 during a fabrication process, resulting in a tensioned membrane. The tensioned membrane 706 can be formed of non-conductive material. For example, the non-conductive material can be silicon nitride. According to another example, the tensioned membrane 706 can be formed of a piezoelectric material. In accordance with still another example, the tensioned membrane 706 can be formed of a piezoresistive material. In still another example, the tensioned membrane 706 can be formed of a polymeric material.

In order to apply the desired amount of tension to the membrane 706, different deposition temperatures and/or different annealed temperatures can be applied to the MEMS sensor 700 during fabrication. For example, if the membrane 706 is composed of silicon nitride of a given thickness, by depositing the silicon nitride at a defined temperature and/or by using a defined annealed temperature after the deposition, a defined stress or a defined tension can be created. Thus, the tension can be changed during the fabrication process by changing a deposition temperature and/or an annealing temperature of the membrane material.

Since the tension is created during fabrication, the tension is fixed in the field (e.g., during use). The selective amount of tension applied to the membrane creates microphones having different properties. For example, a membrane having a high tension can have a lower sensitivity level, a higher bandwidth, and a higher resonant frequency as compared to a membrane having a lower tension amount. In a similar manner, a membrane having a low tension amount, can have a higher sensitivity level, a reduced bandwidth, and a lower resonant frequency as compared to membranes having a higher tension amount. In an example, a low tension amount can be a value that results in a resonant frequency of about 20 kHz and a high tension amount could be a value that results in a resonant frequency of more than 50 kHz.

According to some implementations, the temperatures applied can cause the membrane 706 to stretch such that a selective amount of tension is applied to the membrane 706.

The material used to form the tensioned membrane can be a dielectric material, such as silicon nitride. Therefore, there should be a metallization layer or a thin polysilicon layer, or another conductive material deposited on the membrane.

As illustrated and indicated in the top view of FIG. 7, the membrane 706 and the conductive layers 718 and 722 have circular shapes. In other embodiments, the membrane 706 and the conductive layers 718 and 722 may have other shapes, including elliptical, square, rectangular or another shape. The post 708 can be at or near the center of the circular membrane 706, when viewed from top. In the cross sectional view of FIG. 7, the post 708 divides the membrane 706 into a first portion 712 and a second portion 714. The first portion 712 is illustrated as the portion of the membrane 706 located to the left of the post 708 and the second portion 714 is defined as the portion of the membrane 706 located to the right of the post 708. For the exemplary sensor 700 having a circulate membrane 706, as illustrated in FIG. 7, the top view could resemble a donut shaped device in which the boundaries of the inner and outer boundaries of the conductive layers 718 and 722 are concentric circles having radii R1 and R2 respectively. The circular membrane's portion 706 that is identified in the top view of FIG. 7 is the portion that sits on top of the post 708 and is positioned inside the conductive layers 718 and 722.

Referring to the cross-sectional view of FIG. 7, a first conductive layer 716 can be applied to a first side of the first portion 712 and a second conductive layer 718 can be applied to a second side of the first portion 712. The first side and the second side can be on opposite sides of the first portion 712. Further, a third conductive layer 720 can be applied to a first surface of the second portion 714 and a fourth conductive layer 722 can be applied to a second surface of the second portion 714. The first surface and the second surface can be located on opposite sides of the second portion 714.

Referring still to the cross-sectional view of FIG. 7, according to some implementations, the first conductive layer 716 and the second conductive layer 718 are deposited only at a center point, or substantially the center point, of the first portion 712. Further, the third conductive layer 720 and the fourth conductive layer 722 are deposited only at a center point, or substantially the center point of the second portion 714.

By depositing the conductive layers only at, or near, respective center points of the first portion 712 and the second portion 714, a sensitivity level of the membrane (or respective portions thereof) can be achieved. Since the edges of the membrane 706 are attached to the back plate 710, 704 and the center post 708, the maximum deflection is at the respective center points of the first and second portions 712, 714. Therefore, by sensing the signals only at, or near, the respective center points, the increased sensitivity level is achieved.

For example, the first conductive layer 716 and the second conductive layer 718 can be deposited between radii R1 and R2 that are less than a full radius of the first portion 712. Further, the first conductive layer 716 and the second conductive layer 718 can comprise the same inner and outer radii, or different inner and outer radii. In other words, the first and second conductive layers 716 and 718 can have same of different thicknesses. In another example, the third conductive layer 720 and the fourth conductive layer 722 can be deposited between radii R1 and R2 that are less than a full radius of the second portion 714. Further, the third conductive layer 720 and the fourth conductive layer 722 can comprise the same inner and outer radii, or different inner and outer radii. According to some embodiments, the first conductive layer 716, the second conductive layer 718, the third conductive layer 720, and the fourth conductive layer 722 comprise same or similar inner and outer radii, or different inner and outer radii.

Although discussed with respect to a radius, the one or more radii can have different shapes, which can be regular shapes or irregular shapes. Such shapes can include a circle, an oval, an oblong shape, non-circular shapes, such as approximately polygonal, ovoid, and so on.

According to an implementation, the one or more shapes comprise respective radii between about 0.3 and 0.9 of the respective membrane portions. In another example, the one or shapes comprise respective radii between 0.4 and 0.8 of the respective membrane portions. In another example, the one or more shapes comprise respective radii between about 0.5 and 0.7 of the respective membrane portions. In a further example, the one or more shapes comprise respective radii of about 0.6 of the respective membrane portions.

The first conductive layer 716 and the second conductive layer 718 may be placed on both sides of the circle at the center of the first portion 712 (from top view) to equalize stress (e.g., reduce movement of that portion of the membrane 706). Further the third conductive layer 720 and the fourth conductive layer 722 may be placed on both sides of the circle at the center of the second portion 714 (of top view) to equalize stress (e.g. reduce movement of that portion of the membrane 706).

During use of the microphone (e.g., when a user is talking on their phone or other device), the membrane that is stretched to the desired amount of tension is exposed to an acoustic pressure differential across the microphone. When this pressure differential occurs, at least a center portion of the tensioned membrane is displaced, according to some aspects. For the microphone that includes a center post, one or more portions of the membrane can be displaced (e.g., a center portion of the first portion 712 of the membrane 706, a center portion of the second portion 714 of the membrane 706.

For example, a material, such as a metallization or polysilicon layer, can be deposited on a center portion(s) of the membrane (and/or membrane portions). The most amount of deflection of the membrane can occur at the center portion while an outer portion (e.g., an outer diameter) of the membrane is retained in secured engagement with a dielectric material (e.g., the edges are clamped and do not move) and/or a center post. Sensing a signal only at the center portion can result in a microphone having a higher sensitivity level as compared to other microphones.

As discussed herein the amount of stress is used to control stiffness and resonant frequent of the membrane, or respective portions thereof. Additionally, in other embodiments, the membranes, or respective portions thereof, can have control features (e.g., number of springs, size of springs, and so forth) that can be altered during fabrication to control the stress on the membrane. Further, in other embodiments, the membranes, or respective portions thereof, have control features that can be changed in the device (e.g., MEMS microphone) or that can be changed in the device post-fabrication to tune (or alter) the stress in the membrane.

Methods that may be implemented in accordance with the disclosed subject matter, will be better appreciated with reference to the following flow charts. While, for purposes of simplicity of explanation, the methods are shown and described as a series of blocks, it is to be understood and appreciated that the disclosed aspects are not limited by the number or order of blocks, as some blocks may occur in different orders and/or at substantially the same time with other blocks from what is depicted and described herein. Moreover, not all illustrated blocks may be required to implement the disclosed methods. It is to be appreciated that the functionality associated with the blocks may be implemented by software, hardware, a combination thereof, or any other suitable means (e.g. device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 8:
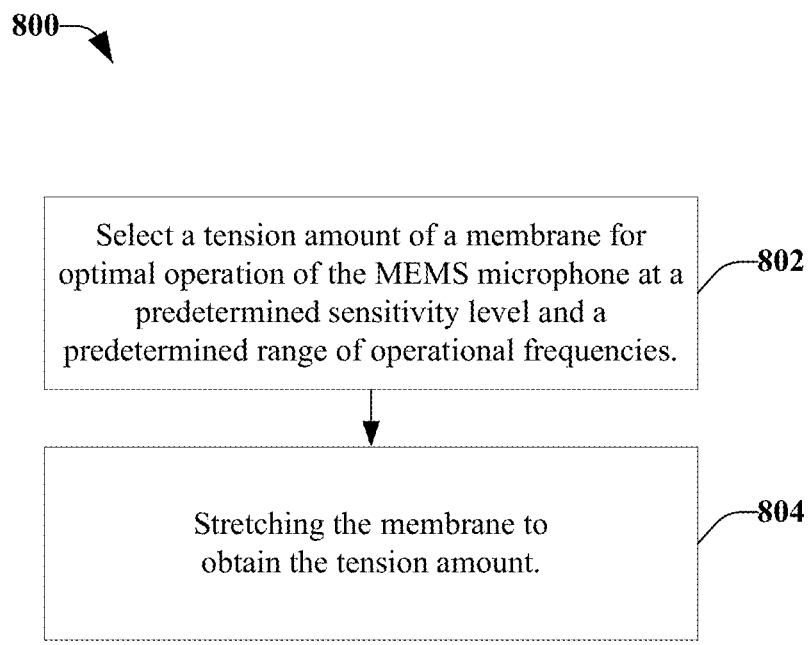
FIG. 8 illustrates an example, non-limiting method for fabricating a MEMS microphone integrated package, which can include the MEMS sensor according to FIG. 3, in accordance with one or more embodiments described herein.

FIG. 8 illustrates an example, non-limiting method 800 for fabricating a MEMS microphone integrated package, which can include the MEMS sensor 300 according to FIG. 3, in accordance with one or more embodiments described herein. At 802, method 800 can include selecting a tension amount of a membrane to cause the MEMS microphone to operate at a predetermined sensitivity level that is above a threshold sensitivity level. For example, the predetermined sensitivity level and the predetermined range of operational frequencies can be selected based on an application in which the MEMS microphone is intended to be utilized.

At 804, method 800 can include stretching the membrane to obtain the tension amount. Stretching the membrane can occur during a fabrication process. It is noted that in at least some embodiments, the membrane is not physically stretched. Instead, the membrane is deposited at a high temperature. Then, when the membrane is cooled to a room temperature, the tension develops in the membrane.

Thus, stretching of the membrane can be facilitated during a deposition process and/or an annealing process during fabrication of the MEMS microphone. In one example, stretching the membrane can include controlling a deposition temperature. In another example, stretching the membrane can include controlling an annealed temperature. In a further example, stretching the membrane can include controlling both the deposition temperature and the annealed temperature.

Figure 9:
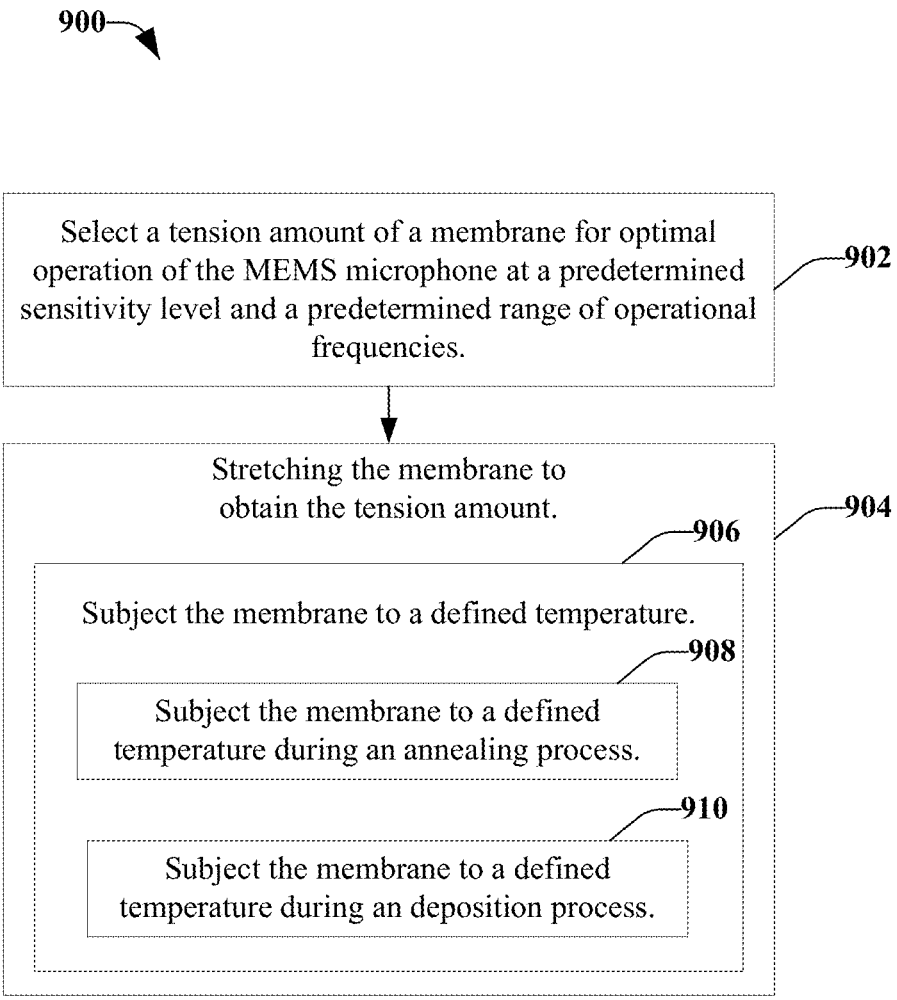
FIG. 9 illustrates an example, non-limiting method for fabricating a MEMS microphone integrated package, which can include the MEMS sensor according to FIG. 7, in accordance with one or more embodiments described herein.

FIG. 9 illustrates an example, non-limiting method 900 for fabricating a MEMS microphone integrated package, which can include the MEMS sensor 700 according to FIG. 7, in accordance with one or more embodiments described herein. At 902, method 900 can include selecting a tension amount of a membrane to cause the MEMS microphone to operate at a predetermined sensitivity level that is above a threshold sensitivity level. The MEMS microphone is configured to operate over a predetermined range of frequencies.

The selective amount of tension applied to the membrane creates microphones having different properties, wherein MEMS microphones exhibiting different properties are fabricating using the same, or substantially the same, components (e.g., the MEMS microphones have a same, or substantially the same, thickness). For example, a membrane having a high tension can have a lower sensitivity level, a higher bandwidth, and a higher resonant frequency as compared to a membrane having a lower tension amount. In a similar manner, a membrane having a low tension amount, can have a higher sensitivity level, a reduced bandwidth, and a lower resonant frequency as compared to membranes having a higher tension amount.

At 904, method 900 can include stretching the membrane to obtain the tension amount. Stretching the membrane can include, at 906, subjecting the membrane to a defined temperature. According to an implementation, at 908, the membrane can be subjected to the defined temperature during a deposition process. According to another implementation, at 910, the membrane can be subjected to the defined temperature during an annealing process. According to a further implementation, the membrane is subjected to a first defined temperature during the deposition process and a second defined temperature during the annealing process.

Figure 10:
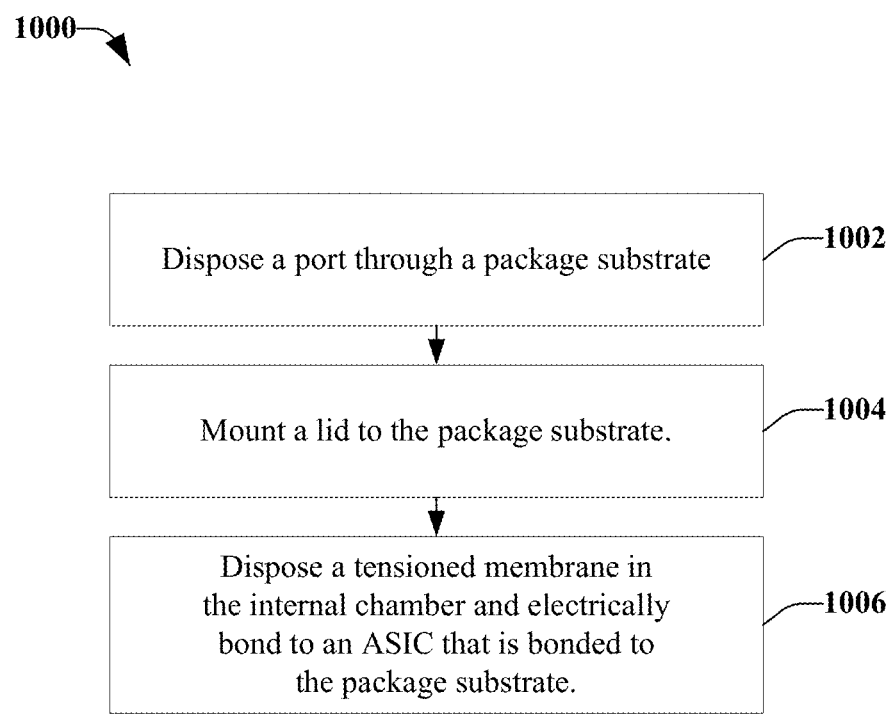
FIG. 10 illustrates another example, non-limiting method for fabricating a MEMS microphone integrated package, which can include the MEMS sensor of FIG. 3 and/or the MEMS sensor of FIG. 7, in accordance with one or more embodiments described herein.

FIG. 10 illustrates another example, non-limiting method 1000 for fabricating a MEMS microphone integrated package, such as the MEMS sensor 300 of FIG. 3 and/or the MEMS sensor 700 of FIG. 7, in accordance with one or more embodiments described herein.

At 1002, the method 1000 can include disposing a port through a package substrate. The port can be configured to receive acoustic waves. At 1004, a lid is mounted to the package substrate. The lid and the package substrate form a package that comprises an internal chamber.

Method 1000 continues at 1006 and a tensioned membrane is disposed in the internal chamber and electrically bonded to the application-specific integrated circuit (ASIC), which is then bonded to the package substrate. It is noted that a direct connection from the sensor to the substrate may or may not exist, depending on the implementation. A tension amount of the membrane can be selected to cause the MEMS microphone to operate at a predetermined sensitivity level that is above a threshold sensitivity level, the MEMS microphone is configured to operate over a predetermined range of frequencies.

According to an implementation, the tension amount is controlled based on a temperature applied to the tensioned membrane during a fabrication process. According to another implementation, the applied temperature comprises a first temperature applied to the tensioned membrane during a deposition process and a second temperature applied to the tensioned membrane during an annealing process.

In another implementation, at least a portion of the tensioned membrane is sandwiched between a first conductive layer and a second conductive layer. In a further implementation, at least a second portion of the tensioned membrane is sandwiched between a third conductive layer and a fourth conductive layer. Further to this implementation, a post is disposed between at least the portion of the tensioned membrane and at least the second portion of the tensioned membrane and is configured to operatively attach the tensioned membrane to a portion of a back plate.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications can be made to adapt a particular situation or material to the essential scope and spirit.

What is claimed is:

1. A micro electro-mechanical system (MEMS) microphone configured to operate over a predetermined range of frequencies and having a tensioned membrane preset at a tension amount selected to cause the MEMS microphone to operate at a predetermined sensitivity level that is above a threshold sensitivity level,
   wherein at least a portion of the tensioned membrane is sandwiched between a first conductive layer and a second conductive layer configured to equalize stress of the tensioned membrane.

2. The MEMS microphone of claim 1, wherein the tension amount is controlled based on a temperature applied to the tensioned membrane during a fabrication process.

3. The MEMS microphone of claim 1, wherein the tensioned membrane is formed of non-conductive material.

4. The MEMS microphone of claim 3, wherein the non-conductive material is silicon nitride.

5. The MEMS microphone of claim 1, wherein the tensioned membrane is formed of a piezoelectric material.

6. The MEMS microphone of claim 1, wherein the tensioned membrane is formed of a piezoresistive material.

7. The MEMS microphone of claim 1, wherein the tensioned membrane is formed of a polymeric material.

8. The MEMS microphone of claim 1, further comprising springs that operatively connect the tensioned membrane to a back plate via one or more portions of dielectric material, wherein the back plate is supported by a substrate.

9. The MEMS microphone of claim 1, further comprising a center post that operatively attaches a center portion of the tensioned membrane to a back plate.

10. The MEMS microphone of claim 9, wherein the center post is configured to divide the tensioned membrane into a first portion and a second portion, wherein the first portion and the second portion are sandwiched between respective first conductive layers and second conductive layers.

11. The MEMS microphone of claim 8, wherein the back plate is formed of non-conductive material, and wherein the MEMS microphone comprises a metallization layer formed on the back plate.

* * * * *